United States Patent
Bucur et al.

(10) Patent No.: US 8,446,142 B2
(45) Date of Patent: May 21, 2013

(54) CAPACITY DETECTOR FOR DETECTING CAPACITY OF AN ENERGY STORAGE UNIT

(75) Inventors: Constantin Bucur, Sunnyvale, CA (US); Jiun Heng Goh, Sunnyvale, CA (US); Flavius Lupu, San Jose, CA (US)

(73) Assignee: O2Micro, Inc., Santa Clara, CA (US)

( * ) Notice: Subject to any disclaimer, the term of this patent is extended or adjusted under 35 U.S.C. 154(b) by 92 days.

(21) Appl. No.: 12/319,077

(22) Filed: Dec. 31, 2008

(65) Prior Publication Data

US 2009/0230972 A1    Sep. 17, 2009

Related U.S. Application Data

(60) Provisional application No. 61/069,084, filed on Mar. 12, 2008.

(51) Int. Cl.
*H03H 1/00* (2006.01)
*H02J 7/04* (2006.01)

(52) U.S. Cl.
USPC ........................................... 323/367; 320/162

(58) Field of Classification Search
USPC ................ 323/364, 367; 320/106, 110, 114, 320/125, 162–164; 324/433, 426
See application file for complete search history.

(56) References Cited

U.S. PATENT DOCUMENTS

| | | | | |
|---|---|---|---|---|
| 5,122,751 A * | 6/1992 | Aita et al. | ...................... | 324/429 |
| 5,610,495 A * | 3/1997 | Yee et al. | ...................... | 320/116 |
| 5,614,807 A * | 3/1997 | Duley | ...................... | 340/636.15 |
| 5,955,869 A * | 9/1999 | Rathmann | ...................... | 320/132 |
| 6,400,123 B1 * | 6/2002 | Bean et al. | ...................... | 320/132 |
| 6,724,658 B2 * | 4/2004 | Micheloni et al. | ....... | 365/185.21 |
| 6,950,030 B2 * | 9/2005 | Kovarik et al. | ............ | 340/636.1 |
| 7,002,869 B2 * | 2/2006 | Zhang et al. | ................... | 365/226 |
| 2003/0069704 A1 * | 4/2003 | Bean | ............................... | 702/63 |
| 2003/0201959 A1 * | 10/2003 | Sakaguchi | ....................... | 345/87 |
| 2006/0033475 A1 * | 2/2006 | Moore | ......................... | 320/132 |
| 2007/0040855 A1 * | 2/2007 | Kato | ............................. | 345/690 |
| 2008/0136378 A1 * | 6/2008 | Iwahana et al. | ............... | 320/153 |
| 2008/0169788 A1 * | 7/2008 | Bobbin et al. | ................ | 320/135 |

FOREIGN PATENT DOCUMENTS

CN    2055293 U    3/1990

OTHER PUBLICATIONS

English translation of Abstract of CN2055293U.
English Translation for First Office Action of Chinese Patent Application No. 200910118767.3.
Jubao Xue, et al., "Universal level LED indicators with widely applications", Practical Electronics, vol. 11, pp. 39-40, Nov. 2005.

* cited by examiner

*Primary Examiner* — Adolf Berhane
*Assistant Examiner* — Emily Pham (57) ABSTRACT

A capacity detector for detecting capacity of an energy storage unit includes a first and a second buffers and a voltage divider. The first buffer is used for generating a first threshold reference according to a first adjustable reference which is predetermined based upon chemistry of the energy storage unit. The second buffer is used for generating a second threshold reference according to a second adjustable reference which is predetermined based upon chemistry of the energy storage unit. The voltage divider coupled to the first buffer and the second buffer is used for dividing a voltage across the first threshold reference and the second threshold reference and for generating capacity references indicating capacity percentages of the energy storage unit according to a voltage versus capacity characteristic of the energy storage unit.

18 Claims, 5 Drawing Sheets

CAPACITY DETECTOR FOR DETECTING CAPACITY OF AN ENERGY STORAGE UNIT

CROSS REFERENCE TO RELATED APPLICATION

This application claims priority to U.S. Provisional Patent Application Ser. No. 61/069,084, entitled "Battery Gauge Detector", filed on Mar. 12, 2008, which is hereby incorporated by reference in its entirety.

BACKGROUND

Electrical energy storage capacity detector, such as a battery gauge, can be used for detecting the capacity of energy storage units, such as Lithium Ion (Li-Ion) batteries which have different types of chemistries like Li-Ion manganese, Li-Ion cobalt, Li-Ion phosphorus, etc. These different types of chemistries may result in different voltage and current characteristics, such as different charge limit voltage characteristics and different voltage versus capacity characteristics. For instance, the charge limit voltage of Li-Ion battery of manganese chemistry can be 4.2V, the charge limit voltage of Li-Ion battery of cobalt chemistry can be 4.2V, the charge limit voltage of Li-Ion battery of nickel-cobalt manganese (NCM) chemistry can be 4.1V, and the charge limit voltage of Li-Ion battery of phosphate chemistry can be 3.6V.

Some typical traditional methods to measure the battery pack capacity include Coulomb counting and cell voltage measurement. The Coulomb counting method measures the net current flowing in the battery by counting the passing charge in order to measure the battery capacity. However, some drawbacks may exist since voltage to frequency converters, higher frequency situation, and frequency compensation for temperature variations may need to be taken into consideration.

The cell voltage measurement method compares an actual battery cell voltage with absolute capacity thresholds of a charged battery. To accommodate different types of battery chemistries, capacity thresholds may need to be set through trimming or a non-volatile integrated memory of a controller.

Both of these methods may require a relatively expensive micro-controller or an extensive circuitry compatible with different battery chemistries and different current ranges in different applications.

SUMMARY

A capacity detector for detecting capacity of an energy storage unit includes a first and a second buffers and a voltage divider. The first buffer is used for generating a first threshold reference according to a first adjustable reference which is predetermined based upon chemistry of the energy storage unit. The second buffer is used for generating a second threshold reference according to a second adjustable reference which is predetermined based upon chemistry of the energy storage unit. The voltage divider coupled to the first buffer and the second buffer is used for dividing a voltage across the first threshold reference and the second threshold reference and for generating capacity references indicating capacity percentages of the energy storage unit according to a voltage versus capacity characteristic of the energy storage unit.

BRIEF DESCRIPTION OF THE DRAWINGS

Features and advantages of embodiments of the invention will become apparent as the following detailed description proceeds, and upon reference to the drawings, where like numerals depict like elements, and in which.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "generating," "dividing," "detecting" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments described herein may be discussed in the general context of computer-executable instructions residing on some form of computer-usable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

By way of example, and not limitation, computer-usable media may comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information.

Communication media can embody computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. Combinations of any of the above should also be included within the scope of computer-readable media.

According to one embodiment of the present invention, a capacity detector for detecting capacity of an energy storage unit is provided. The capacity detector can provide capacity references according to a voltage versus capacity characteristic of the energy storage unit, in one embodiment. In addition, the capacity detector can be compatible with different applications. Embodiments according to the invention are discussed in the context of batteries (e.g., Li-ion batteries); however, the invention is not so limited. In general, the invention can be well-suited for other types of energy storage units.

Figure 1:
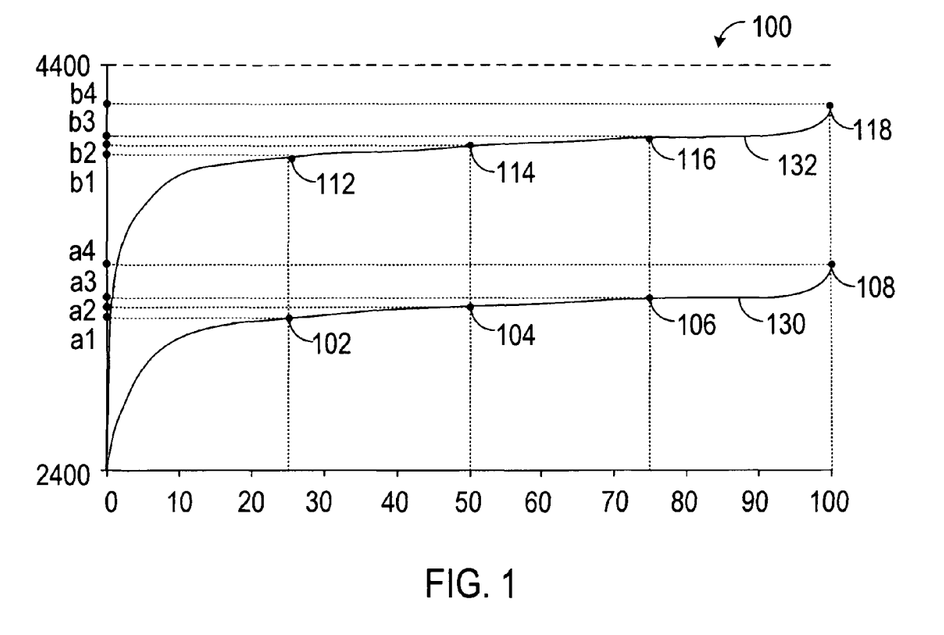
FIG. 1 is a diagram showing curves of battery voltage versus battery capacity characteristics, in accordance with one embodiment of the present invention.

FIG. 1 shows a diagram 100 of curves illustrating battery voltage versus battery capacity characteristics, in accordance with one embodiment of the present invention. The x-axis of the diagram 100 represents the battery capacity percentage and the y-axis of the graph 100 represents the battery voltage in millivolt (mV). Two curves 130 and 132 represent the characteristics of voltage versus capacity of two Li-Ion batteries with different chemistries.

For example, the curve 130 represents the characteristic of voltage versus capacity of the battery with one type of chemistry (hereinafter referred to as $A_1$ battery). As shown on curve 130, points 102, 104, 106, and 108 indicate that the capacity percentages of the $A_1$ battery are 25%, 50%, 75%, and 100%, when the voltages of the $A_1$ battery are $a_1$, $a_2$, $a_3$ and $a_4$ mV, respectively.

The curve 132 represents the characteristic of the voltage versus capacity of the battery with another type of chemistry (hereinafter referred to as $B_1$ battery). Points 112, 114, 116 and 118 indicate that the capacity percentages of $B_1$ battery are 25%, 50%, 75% and 100%, when the voltages of the $B_1$ battery are $b_1$, $b_2$, $b_3$ and $b_4$ mV, respectively.

Different energy storage units can have different voltage versus capacity characteristics. However, if the voltage of the energy storage unit is known/given, the capacity of the energy storage unit can be determined according to the corresponding voltage versus capacity characteristic.

Figure 2:
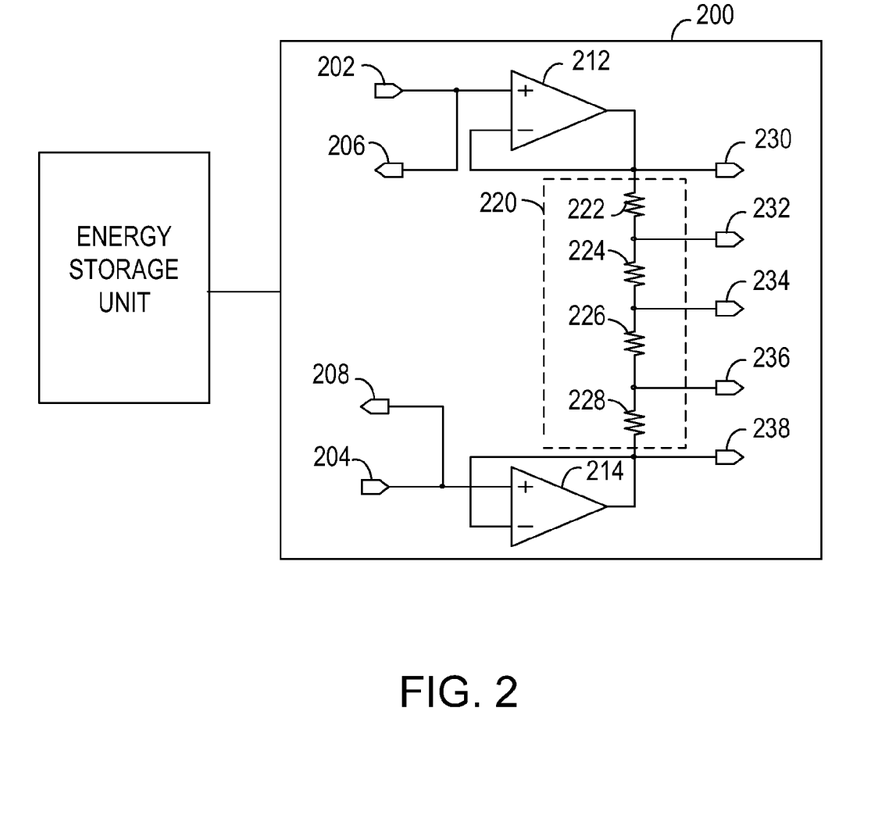
FIG. 2 shows a capacity detector for detecting capacity of an energy storage unit, in accordance with one embodiment of the present invention.

FIG. 2 shows a capacity detector 200 for detecting capacity of an energy storage unit, according to one embodiment of the present invention. In one embodiment, the capacity detector 200, such as a battery gauge detector, can be used to provide threshold references and capacity references. The capacity detector 200 comprises a first buffer 212, a second buffer 214, and a voltage divider 220 coupled to the buffers 212 and 214.

In one embodiment, two predetermined and adjustable references, such as a first adjustable reference 202 and a second adjustable reference 204 which can indicate the voltage limits of the energy storage unit are respectively input to the buffers 212 and 214. The first adjustable reference 202 and a second adjustable reference 204 can be predetermined according to chemistry of the energy storage unit. More specifically, the first adjustable reference 202 can be an upper limit voltage reference and the second adjustable reference 204 can be a lower limit voltage reference. In one embodiment, buffers 212 and 214 can function as voltage followers and the circuit gain of each voltage follower is approximately one. Thus, a first threshold reference 230 and a second threshold reference 238 can be substantially equal to the adjustable references 202 and 204, respectively.

As such, the first buffer 212 can be used for generating the first threshold reference 230 according to the first adjustable reference 202 which is predetermined based upon chemistry of the energy storage unit. The second buffer 214 can be used for generating the second threshold reference 238 according to the second adjustable reference 204 which is predetermined based upon chemistry of the energy storage unit.

Advantageously, adjustable references 202 and 204 can also be directly used as (or can be used to provide) an over-voltage threshold and an under-voltage threshold respectively for protection purposes. In the example of FIG. 2, the voltage thresholds 206 and 208 are substantially equal to the adjustable references 202 and 204, respectively. In one embodiment, the threshold 206 can be used as an over-voltage threshold for an over-voltage protection circuit. For example, battery charging can be terminated when the over-voltage protection circuit detects that the battery voltage is equal to or greater than the over-voltage threshold 206. Similarly, the threshold 208 can be used as an under-voltage threshold for an under-voltage protection circuit. For example, battery discharging can be terminated when the under-voltage protection circuit detects that the battery voltage is equal to or less than the under-voltage threshold 208.

The voltage divider 220 can be used for dividing the voltage across the first threshold reference 230 and the second threshold reference 238 and for providing several capacity references 232, 234 and 236. In one embodiment, the voltage divider 220 includes a plurality of resistors 222, 224, 226 and 228 coupled in series for providing the capacity references 232, 234 and 236. The resistance of the resistors 222, 224, 226 and 228 can be predetermined. The capacity references 232, 234 and 236 can be used for indicating capacity percentages of the energy storage unit according to the voltage versus capacity characteristic of the electrical energy storage. In one embodiment, the threshold references 230 and 238 can also be used to indicate the capacity percentages of the energy storage unit. Taking the $A_1$ battery for example, the capacity references 232, 234 and 236 can be set to $a_3$, $a_2$ and $a_1$ mV as shown in FIG. 1 to indicate that the capacity percentages of the $A_1$ battery are 75%, 50% and 25%, respectively. The first threshold reference 230 and the second threshold reference 238 can indicate that the capacity percentages of the $A_1$ battery are 100% and 0% since they respectively indicate the upper limit battery voltage and the lower limit battery voltage, in one embodiment.

Advantageously, the capacity detector 200 can be compatible for different battery chemistries by varying the adjustable references 202 and 204. Furthermore, by varying a dividing proportion, the voltage divider 220 can be used for providing various capacity references to meet different application requirements. For example, the capacity references can be used for indicating other capacity percentages, such as 30% and 40%, which can be adjusted according to different applications. By varying the resistance of the resistors 222, 224, 226 and 228, the capacity references 232, 234 and 236 can be varied to meet different application requirements, in one embodiment.

Figure 3:
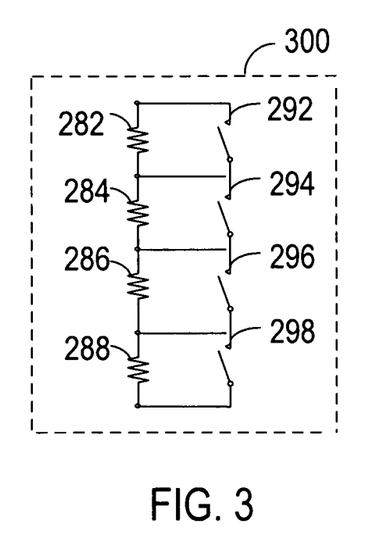
FIG. 3 shows a resister in a capacity detector for detecting capacity of an energy storage unit, in accordance with to one embodiment of the present invention.

In one embodiment, to increase the flexibility of the capacity detector 200, the resistance of resistors 222, 224, 226 and 228 can be varied by using several individual resistors. FIG. 3 shows a resister 300 which can be any of the resistors 222, 224, 226 and 228 shown in FIG. 2 according to one embodiment of the present invention. The resistors 300 can include several individual resistors 282, 284, 286 and 288 coupled in series. Each individual resistor is coupled in parallel to a corresponding switch 292, 294, 296 or 298. The switches 292, 294, 296 and 298 can be switched ON and OFF. In one embodiment, the switches 292, 294, 296 and 298 can be controlled by programming. By controlling the switches 292, 294, 296 and 298, e.g., by enabling some of switches and disabling others, the resistance of the resistor 300 can be varied. As such, the capacity references, e.g., the capacity references 232, 234 and 236 shown in FIG. 2, can be varied to be compatible with the characteristics of voltage versus capacity of corresponding energy storage units. For example, for the $B_1$ battery, the resistance of the resistors 222, 224, 226 and 228 can be adjusted to output the capacity references 232, 234 and 236 of $b_3$, $b_2$ and $b_1$ mV in FIG. 1 to indicate the capacity percentages of 75%, 50% and 25%, respectively.

Figure 4:
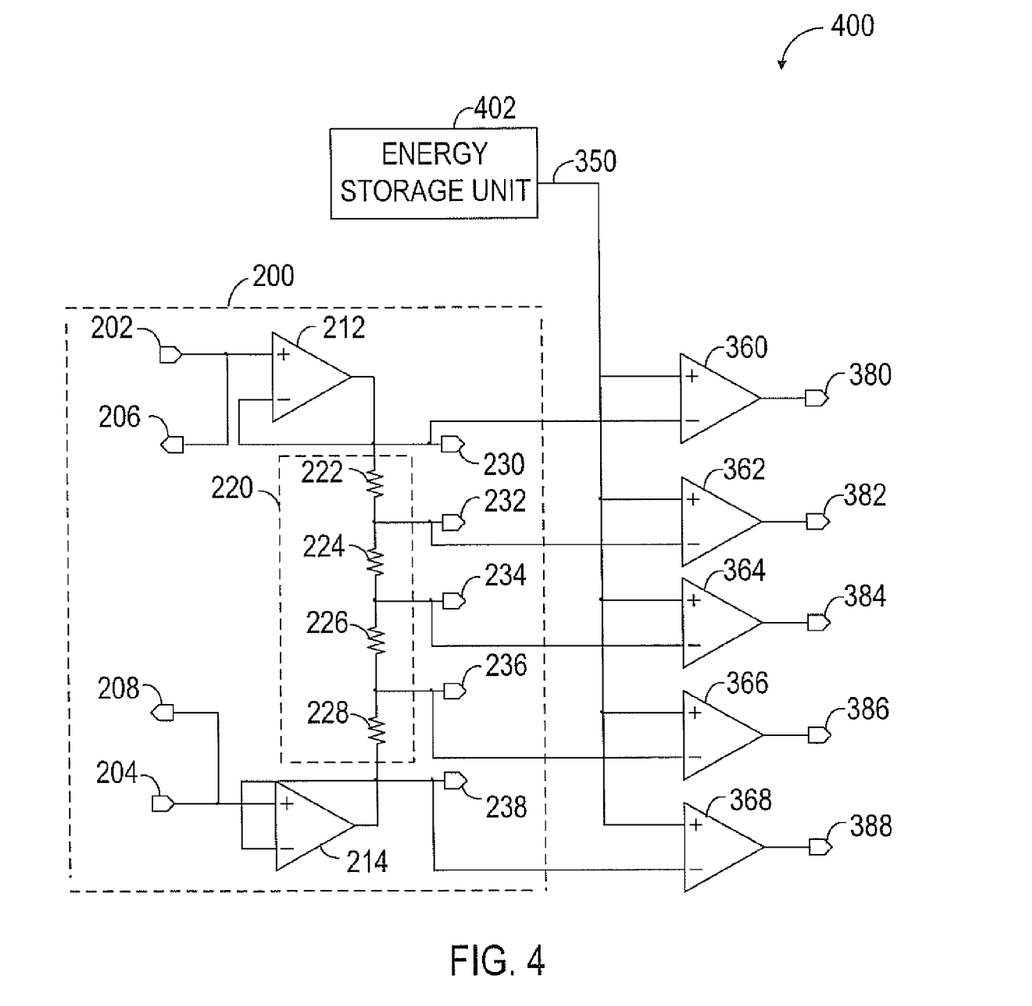
FIG. 4 shows a system for detecting capacity of an energy storage unit, in accordance with one embodiment of the present invention.

FIG. 4 shows a system 400 for detecting capacity of an energy storage unit 402, which employs the capacity detector 200 in FIG. 2, according to one embodiment of the present invention. The system 400 can be used for generating several capacity indication signals indicative of the capacity percentages of the energy storage unit 402. In one embodiment, the capacity references 232, 234 and 236 and the threshold references 230 and 238 are respectively sent to comparators 362, 364, 366, 360 and 368 to be compared with a sensed voltage 350 of the energy storage unit 402.

In one embodiment, the comparator 362 is used to compare the capacity reference 232 with the sensed voltage 350 and to output a capacity indication signal 382 according to a comparison result. In one embodiment, a positive status of the capacity indication signal 382 indicates that the sensed voltage 350 is greater than the capacity reference 232 and the capacity of the energy storage unit is greater than the capacity which the capacity reference 232 indicates. Similarly, comparators 360, 364, 366 and 368 can output capacity indication signals 380, 384, 386 and 388 respectively to indicate the capacities. For example, if the capacity reference 232 is provided to indicate the capacity percentage of 75%, when the capacity indication signal 382 is positive, the capacity percentage of the electrical energy storage is more than 75%. In one embodiment, the capacity indication signals 382, 384 and 386 can be used for indicating capacity of the energy storage unit according to the comparison results of the sensed voltage 350 and the capacity references 232, 234 and 236. Furthermore, the capacity indication signal 380 and 388 can also be used for indicating capacity of the energy storage unit according to the comparison results of the sensed voltage 350 and the threshold references 230 and 238.

Thus, by comparing the sensed voltage 350 with the capacity references 232, 234 and 236 and threshold references 230 and 238, the capacity of the energy storage unit can be determined and corresponding control signals for energy management can be provided.

In one embodiment, the capacity detector 200 in FIG. 2 or the system 400 in FIG. 4 can be controlled by a switch and activated periodically for reducing the power consumption.

Figure 5:
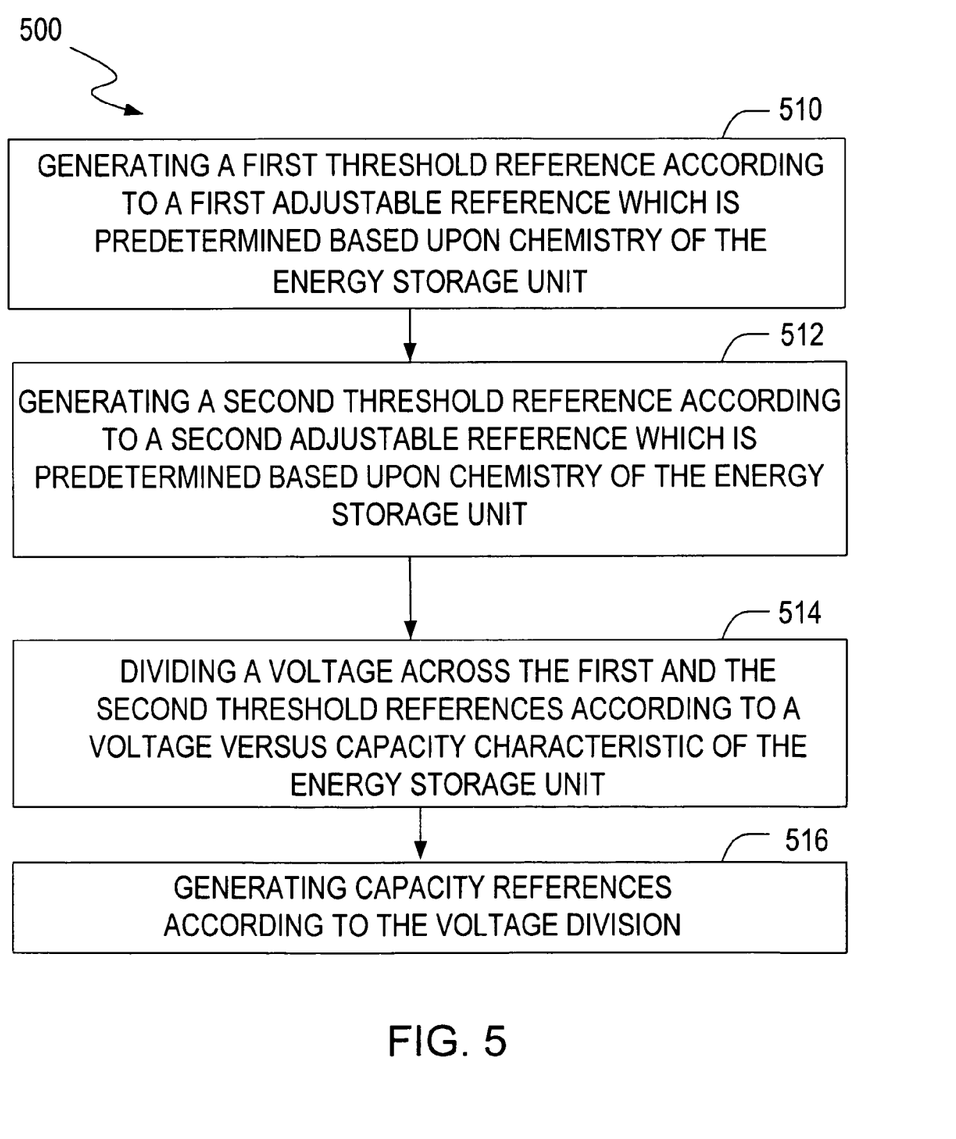
FIG. 5 is a flowchart showing a method for detecting capacity of an energy storage unit, in accordance with one embodiment of the present invention.

FIG. 5 shows a method 500 for detecting capacity of an energy storage unit in accordance with one embodiment of the present invention. FIG. 5 is described in combination with FIG. 4.

At 510, a first threshold reference 230 is generated, e.g., by a first buffer 212, according to a first adjustable reference 202 which is predetermined based upon chemistry of the energy storage unit.

At 512, a second threshold reference 238 is generated, e.g., by a second buffer 214, according to a second adjustable reference 204 which is predetermined based upon chemistry of the energy storage unit. Since different energy storage unit chemistries may have different charge limit voltages, the adjustable references 202 and 204 can be determined according to the chemistry of the corresponding energy storage unit and/or application requirements.

At 514, a voltage divider 220 including a plurality of resistors 222, 224, 226 and 228 coupled in series can be used for dividing a voltage across the first threshold reference 230 and the second threshold reference 238 according to a voltage versus capacity characteristic of the energy storage unit. In one embodiment, the resistances of the resistors 222, 224, 226 and 228 can be predetermined according to chemistry of the corresponding energy storage unit and/or application requirements.

At 516, capacity references 234, 236 and 238 can be generated according to the voltage division. The capacity references 234, 236 and 238 and threshold references 230 and 238 can be used to respectively indicate the capacity percentages of the energy storage unit. In addition, capacity indication signals 380, 382, 384, 386 and 388 can be generated by comparing a sensed voltage 350 with the capacity references 232, 234 and 236 and the threshold references 230 and 238, respectively. Furthermore, in one embodiment, an over-voltage condition can be detected by comparing the sensed 350 voltage to the first threshold reference 230. An over-voltage condition can be detected by comparing the sensed voltage to the second threshold reference 238.

Accordingly, embodiments in accordance with the present invention provide a capacity detector/system that can detect capacity of an energy storage unit according to the corresponding voltage versus capacity characteristic of the energy storage unit. Advantageously, the capacity reference of the capacity detector/system can be adjusted so as to be compatible with different applications.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A capacity detector for detecting capacity of an energy storage unit, comprising:
a first buffer operable for generating a first threshold reference according to a first adjustable reference which is predetermined based upon a voltage versus capacity characteristic of said energy storage unit, said first adjustable reference corresponding to an upper-limit capacity of said energy storage unit;
a second buffer operable for generating a second threshold reference according to a second adjustable reference which is predetermined based upon said voltage versus capacity characteristic of said energy storage unit, said second adjustable reference corresponding to a lower-limit capacity of said energy storage unit; and
a voltage divider coupled to said first buffer and said second buffer, and operable for dividing a voltage across said first threshold reference and said second threshold reference to provide a plurality of capacity references indicating a plurality of capacity information of said energy storage unit, wherein said capacity references are generated according to said voltage versus capacity characteristic of said energy storage unit, and wherein a sensed voltage of said energy storage unit is compared to said capacity references to generate a plurality of capacity indication signals indicative of capacity information of said energy storage unit.

2. The capacity detector of claim 1, wherein said voltage divider comprises:
a plurality of resistors coupled in series and operable for providing said capacity references, wherein resistance values of said resistors are set according to said voltage versus capacity characteristic.

3. The capacity detector of claim 2, wherein said capacity references vary in accordance with variance of resistance of said resistors.

4. The capacity detector of claim 2, wherein at least one of said resistors comprises:
a plurality of individual resistors coupled in series; and
a plurality of switches respectively coupled to said individual resistors in parallel.

5. The capacity detector of claim 1, wherein said energy storage unit comprises a battery.

6. The capacity detector of claim 1, wherein said first adjustable reference is capable of being used as an over-voltage threshold for protecting said energy storage unit.

7. The capacity detector of claim 1, wherein said second adjustable reference is capable of being used as an under-voltage threshold for protecting said energy storage unit.

8. A system for detecting capacity of an energy storage unit, comprising:
a capacity detector coupled to said energy storage unit and operable for receiving a first adjustable reference and a second adjustable reference which are predetermined according to a voltage versus capacity characteristic of said energy storage unit, wherein said first adjustable reference corresponds to an upper-limit capacity of said energy storage unit, and said second adjustable reference corresponds to a lower-limit capacity of said energy storage unit, and wherein said capacity detector is further operable for generating a first threshold reference according to said first adjustable reference and generating a second threshold reference according to said second adjustable reference, and operable for dividing a voltage across said first threshold reference and said second threshold reference according to said voltage versus capacity characteristic of said energy storage unit to provide a plurality of capacity references indicating a plurality of capacity information of said energy storage unit; and
a plurality of comparators coupled to said capacity detector and operable for respectively comparing a sensed voltage of said energy storage unit to said capacity references and operable for generating a plurality of capacity indication signals indicative of capacity information of said energy storage unit based on a result of said comparing.

9. The system of claim 8, wherein said energy storage unit comprises a battery.

10. The system of claim 8, wherein said capacity indication signals are capable of indicating capacity of said energy storage unit according to a plurality of comparison results of said sensed voltage and said capacity references.

11. The system of claim 8, wherein said capacity detector comprises:
a first buffer operable for generating said first threshold reference according to said first adjustable reference which is predetermined based upon chemistry of said energy storage unit;
a second buffer operable for generating said second threshold reference according to said second adjustable reference which is predetermined based upon chemistry of said energy storage unit; and
a voltage divider coupled to said first buffer and said second buffer, operable for dividing said voltage across said first threshold reference and said second threshold reference and operable for generating said capacity references indicative of a plurality of capacity information of said energy storage unit.

12. The system of claim 11, wherein said voltage divider comprises:
a plurality of resistors coupled in series for providing said capacity references, wherein resistance values of said resistors are set according to said voltage versus capacity characteristic.

13. The system of claim 12, wherein said capacity references vary in accordance with variance of resistance of said resistors.

14. A method for detecting capacity of an energy storage unit, comprising:
receiving a first adjustable reference and a second adjustable reference which are predetermined according to a voltage versus capacity characteristic of said energy storage unit, said first adjustable reference corresponding to an upper-limit capacity of said energy storage unit, and said second adjustable reference corresponding to a lower-limit capacity of said energy storage unit;
generating a first threshold reference according to said first adjustable reference;
generating a second threshold reference according to said second adjustable reference;
dividing a voltage across said first threshold reference and said second threshold reference according to said voltage versus capacity characteristic of said energy storage unit; and
generating a plurality of capacity references indicating a plurality of capacity information of said energy storage unit according to results of said dividing.

15. The method of claim 14, further comprising:
generating a plurality of capacity indication signals by comparing a sensed voltage of said energy storage unit to said capacity references, respectively.

16. The method of claim 15, further comprising:
detecting an over-voltage condition by comparing said sensed voltage to said first threshold reference.

17. The method of claim 15, further comprising:
detecting an under-voltage condition by comparing said sensed voltage to said second threshold reference.

18. The method of claim 14, wherein said energy storage unit comprises a Lithium Ion (Li-Ion) battery.

* * * * *